United States Patent
Jo

(10) Patent No.: US 10,290,597 B2
(45) Date of Patent: May 14, 2019

(54) SEMICONDUCTOR DEVICE

(71) Applicant: LG INNOTEK CO., LTD., Seoul (KR)

(72) Inventor: Yeong Deuk Jo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 72 days.

(21) Appl. No.: 15/502,412

(22) PCT Filed: Jul. 31, 2015

(86) PCT No.: PCT/KR2015/008022
§ 371 (c)(1),
(2) Date: Feb. 7, 2017

(87) PCT Pub. No.: WO2016/021879
PCT Pub. Date: Feb. 11, 2016

(65) Prior Publication Data
US 2017/0236793 A1    Aug. 17, 2017

(30) Foreign Application Priority Data

Aug. 7, 2014 (KR) .................. 10-2014-0101511

(51) Int. Cl.
*H01L 23/00* (2006.01)
*H01L 21/20* (2006.01)
(Continued)

(52) U.S. Cl.
CPC ............. *H01L 24/05* (2013.01); *H01L 21/20* (2013.01); *H01L 24/03* (2013.01); *H01L 29/417* (2013.01); *H01L 29/41725* (2013.01); *H01L 29/42316* (2013.01); *H01L 29/7786* (2013.01); *H01L 29/872* (2013.01); *H01L 33/38* (2013.01); *H01L 29/2003* (2013.01); *H01L 33/387* (2013.01); *H01L 33/62* (2013.01); *H01L 2224/0382* (2013.01); *H01L 2224/03848* (2013.01); *H01L 2224/04042* (2013.01); *H01L 2224/05016* (2013.01); *H01L 2224/05023* (2013.01);
(Continued)

(58) Field of Classification Search
CPC ........................................ H01L 24/10
See application file for complete search history.

(56) References Cited

U.S. PATENT DOCUMENTS

| | | | | |
|---|---|---|---|---|
| 2009/0173993 A1* | 7/2009 | Andrews | ............. | H01L 29/0657 257/330 |
| 2009/0194874 A1* | 8/2009 | Lee | ........................ | H01L 24/10 257/738 |

FOREIGN PATENT DOCUMENTS

| | | |
|---|---|---|
| JP | 63095650 A | 4/1988 |
| JP | 2011165853 A | 8/2011 |

(Continued)

OTHER PUBLICATIONS

International Search Report in International Application No. PCT/KR2015/008022, filed Jul. 31, 2015.

*Primary Examiner* — Tucker J Wright
*Assistant Examiner* — Christopher A Culbert
(74) *Attorney, Agent, or Firm* — Saliwanchik, Lloyd & Eisenschenk

(57) ABSTRACT

A semiconductor device according to an embodiment comprises a substrate, an epitaxial layer on the substrate, and a cluster including a plurality of particles disposed on the epitaxial layer, the particles being disposed to be apart from each other, and contacting the epitaxial layer.

14 Claims, 7 Drawing Sheets

(51) Int. Cl.
  *H01L 29/417*  (2006.01)
  *H01L 29/423*  (2006.01)
  *H01L 29/778*  (2006.01)
  *H01L 29/872*  (2006.01)
  *H01L 33/38*  (2010.01)
  *H01L 29/20*  (2006.01)
  *H01L 33/62*  (2010.01)
(52) U.S. Cl.
  CPC ............ *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05184* (2013.01); *H01L 2224/48091* (2013.01); *H01L 2224/48106* (2013.01); *H01L 2224/48245* (2013.01); *H01L 2224/48453* (2013.01); *H01L 2224/48463* (2013.01); *H01L 2224/49111* (2013.01); *H01L 2224/73265* (2013.01); *H01L 2924/12032* (2013.01); *H01L 2924/12041* (2013.01); *H01L 2924/13063* (2013.01); *H01L 2924/13064* (2013.01)

(56) References Cited

FOREIGN PATENT DOCUMENTS

| KR | 1006138440000 | B1 |   | 8/2006 |
|----|---------------|----|---|--------|
| KR | 101007140     | B1 |   | 1/2011 |
| KR | 20110087249   | A  |   | 8/2011 |
| KR | 20120029660   | A  | * | 3/2012 |
| KR | 20120029660   | A  |   | 3/2012 |
| KR | 20130030840   | A  |   | 3/2013 |

* cited by examiner

SEMICONDUCTOR DEVICE

CROSS-REFERENCE TO RELATED APPLICATION

This application is the U.S. national stage application of International Patent Application No. PCT/KR2015/008022, filed Jul. 31, 2015, which claims priority to Korean Application No. 10-2014-0101511, filed Aug. 7, 2014, the disclosures of each of which are incorporated herein by reference in their entirety.

TECHNICAL FIELD

The embodiment relates to a semiconductor device.

BACKGROUND ART

Gallium nitride (GaN) materials with broad energy bandgap has characteristics such as superior forward characteristics, a high breakdown voltage, and a low intrinsic carrier density, the characteristics being suitable for power semiconductor devices such as power switches.

There is a Schottky barrier diode, a metal semiconductor field effect transistor, or a high electron mobility transistor (HEMT), etc., as a power semiconductor device.

In the case of such a semiconductor device, since the variation width of the leakage current is uneven, the breakdown voltage is low and the characteristics of the device cannot be predicted so that the reliability of the device is low.

DISCLOSURE

Technical Problem

The embodiment provides a semiconductor device having superior breakdown voltage characteristics.

Technical Solution

A semiconductor device according to an embodiment may include a substrate; an epitaxial layer on the substrate; and a cluster electrode including the plurality of particles disposed on the epitaxial layer, the particles being disposed to be apart from each other, and contacting the epitaxial layer.

The plurality of particles may include a shape of at least one of spherical, hemispherical, or polyhedral.

The semiconductor device may further include a first oxidation layer disposed in a wedge shape between the plurality of particles and the epitaxial layer. Alternatively, the semiconductor device may further include first oxidation layers disposed between the plurality of particles and the epitaxial layer and contacting at least one of the particles or the epitaxial layer.

The separation distance between the plurality of first oxidation layers may be the same as an average diameter of each of the plurality of particles. Alternatively, a separation distance between the plurality of first oxidation layers may be greater than zero and smaller than several hundreds of micrometers.

The semiconductor device may further include a second oxidation layer disposed between the particles and on the epitaxial layer. The second oxidation layer may be disposed to be apart from or to contact the plurality of particles.

The second oxidation layer may have a plate-like cross-sectional shape.

The semiconductor device may further include a second oxidation layer disposed on the epitaxial layer between the plurality of first oxidation layers.

The first and second oxidation layers may be integrally formed. Alternatively, the first and second oxidation layers may be disposed to be apart from each other.

The semiconductor device may further include a lower electrode disposed on a bottom surface of the substrate.

The semiconductor device may further include the plurality of wires connected to the plurality of particles, respectively.

The plurality of the particles may be disposed at equal intervals or at different intervals from each other.

The plurality of the particles may have a planar shape arranged in a matrix form, in a honeycomb form, or in random form.

Each of the particles may include at least one of Ag, Al, Au, Cr, Cu, Ni, Ti, or W.

At least one of the epitaxial layer or the substrate may include at least one of group IV semiconductor, group III-V compound semiconductor, or group II-VI compound semiconductor.

A volume of each of the plurality of particles may be several $\mu m^3$ to several hundred $\mu m^3$.

The epitaxial layer may include a light emitting structure, wherein the light emitting structure may include a first conductive semiconductor layer, an active layer, and a second conductive semiconductor layer disposed on the substrate.

The epitaxial layer may include a channel layer on the substrate; and an electron supply layer disposed on the channel layer and forming a heterojunction interface with the channel layer, wherein the cluster electron may be disposed on the electron supply layer.

The first oxidation layers may be smaller in size than the particles, and the second oxidation layer may be smaller in size than the particle.

Advantageous Effects

The semiconductor device according to the embodiment has excellent breakdown voltage characteristics and improved withstand voltage characteristics because an electrode is in the form of a plurality of particles so that the electric field is non-concentrated and dispersed, and makes the masking and etching processes for forming the electrode to be unnecessary, thereby reducing the process cost and shortening the process time.

BEST MODE

Figure 1:
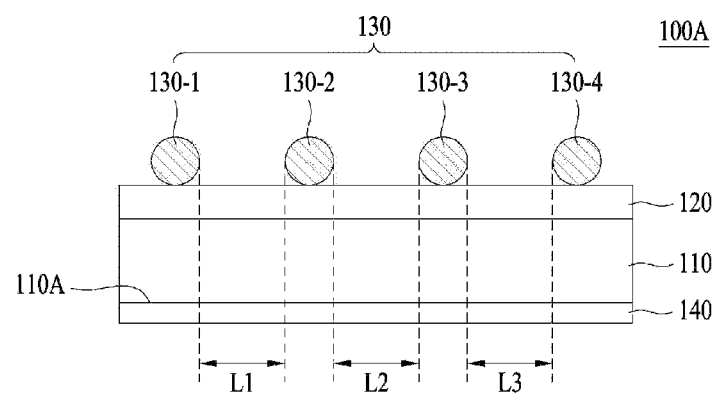
FIG. 1 shows a cross-sectional view of a semiconductor device according to an embodiment.

Hereinafter, exemplary embodiments will be described in order to concretely describe the present invention and in detail with reference to the accompanying drawings to aid in understanding of the present invention. However, the embodiments according to the present invention may be altered in various ways, and the scope of the present invention should not be construed as being limited to the embodiments described as follows. The embodiments according to the present invention are intended to provide those skilled in the art with more complete explanation.

In the following description of the embodiments according to the present invention, it will be understood that, when each element is referred to as being formed "on" or "under" the other element, it can be directly "on" or "under" the other element, or can be indirectly formed with one or more intervening elements therebetween. In addition, it will also be understood that "on" or "under" the element may mean an upward direction and a downward direction based on the element.

In addition, the relative terms "first", "second", "top/upper/above", "bottom/lower/under" and the like in the description and in the claims may be used to distinguish between any one substance or element and other substances or elements and not necessarily for describing any physical or logical relationship between the substances or elements, or a particular order.

In the drawings, the dimensions such as thicknesses and sizes of layers may be exaggerated, omitted, or illustrated schematically for clarity and convenience of description. In addition, the dimensions of constituent elements do not precisely reflect the actual dimensions.

FIG. 1 shows a cross-sectional view of a semiconductor device 100A according to an embodiment.

The semiconductor device 100A shown in FIG. 1 may include a substrate 110, an epitaxial layer 120, and a cluster electrode 130.

The epitaxial layer 120 may be disposed on the substrate 110. Here, at least one of the substrate 110 or the epitaxial layer 120 may include at least one of group IV semiconductor, group III-V compound semiconductor, or group II-VI compound semiconductor. Each of the substrate 110 and the epitaxial layer 120 may be implemented in, for example, the group IV semiconductor such as carbon (C), silicon (Si), germanium (Ge), silicon carbide (SiC), the group III-V compound semiconductor such as gallium arsenide (GaAs), gallium nitride (GaN), and the group II-VI compound semiconductor such as zinc oxide (ZnO), zinc selenide (ZnSe), cadmium telluride (CdTe).

Also, the substrate 110 may comprise a conductive material or non-conductive material. For example, the substrate 110 may comprise at least one of sapphire ($Al_2O_3$), GaP, InP, or $Ga_2O_3$.

Also, the substrate 110 and the epitaxial layer 120 may comprise materials of the same type or different type.

The cluster electrode 130 may include the plurality of particles, which is disposed to be apart from each other, disposed on the epitaxial layer 120, and electrically contact the epitaxial layer 120. Although the cluster electrode 130 may include four particles 130-1, 130-2, 130-3, and 130-4 as shown in FIG. 1, the embodiment is not limited thereto. In another embodiment, the number of the particles included in the cluster electrode 130 may be greater than or less than 4.

Each of the particles of the cluster electrode 130 may include at least one of silver (Ag), aluminum (Al), gold (Au), chromium (Cr), copper (Cu), nickel (Ni), titanium (Ti), or tungsten (W). However, the embodiments are not limited to the specific structure material of each of the particles 130-1 to 130-4.

The plurality of the particles 130-1 to 130-4 may be disposed at equal or different intervals from each other. Referring to FIG. 1, a separation distance L1 between the particles 130-1 and 130-2 adjacent to each other, a separation distance L2 between the other particles 130-2 and 130-3 adjacent to each other, and a separation distance L3 between the other particles 130-3 and 130-4 adjacent to each other may be the same or different.

Further, the volume of each of the plurality of particles 130-1 to 130-4 may be several $\mu m^3$ to several hundred $\mu m^3$. However, the embodiment is not limited to the sizes of the plurality of particles 130-1, 130-2, 130-3, and 130-4.

The volumes of the plurality of particles 130-1 to 130-4 may be equal to or different from each other.

In addition, the plurality of particles 130-1 to 130-4 may have a sphere shape as shown in FIG. 1, but the embodiment is not limited thereto. That is, the plurality of particles 130-1, 130-2, 130-3, and 130-4 may have a shape of at least one of spheres, hemispheres, or polyhedrons.

In addition, the plurality of particles 130-1 to 130-4 may have the same or different shapes.

In addition, the semiconductor device 100A shown in FIG. 1 may further include a lower electrode 140. The lower electrode 140 may be disposed on a bottom surface 110A of the substrate 110. The lower electrode 140 may include a metal material. For example, the lower electrode 140 may be formed of refractory metals or a mixture of these refractory metals. Alternatively, the lower electrode 140 may include at least one of platinum (Pt), germanium (Ge), copper (Cu), Chromium (Cr), Nickel (Ni), gold (Au), titanium (Ti), aluminum (Al), tantalum (Ta), tantalum nitride (TaN), titanium nitride (TiN), palladium (Pd), tungsten (W), or tungsten silicide ($WSi_2$). However, the embodiment is not limited thereto.

Figure 2:
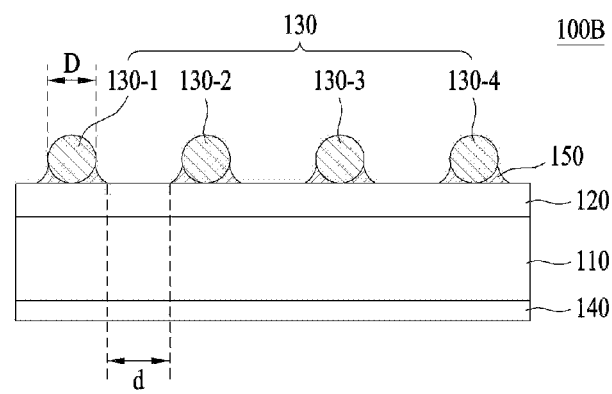
FIG. 2 shows a cross-sectional view of the semiconductor device according to another embodiment.

FIG. 2 shows a cross-sectional view of the semiconductor device 100B according to another embodiment.

Unlike the semiconductor device 100A shown in FIG. 1, the semiconductor layer 100B shown in FIG. 2 may further include a first oxidation layer 150. Except for this, the semiconductor device 100B shown in FIG. 2 is the same as the semiconductor device 100A shown in FIG. 1, and thus is designated by the same reference numerals and a repeated description thereof is omitted or the description of FIG. 1 is substituted for the description of FIG. 2.

As shown in FIG. 2, the first oxidation layer 150 may be disposed in a space between the plurality of particles 130-1 to 130-4 and the epitaxial layer 120. Here, the first oxidation layer 150 can electrically contact at least one of the plurality of particles 130-1 to 130-4 or the epitaxial layer 120.

In addition, the first oxide layer 150 may be smaller than the particles 130-1 to 130-4.

In addition, the first oxidation layer 150 may be disposed in a wedge shape stuck in an empty space between the plurality of particles 130-1 to 130-4 and the epitaxial layer 120.

Further, the separation distance 'd' between the plurality of first oxidation layers 150 may be the same as the average diameter (D) of the plurality of particles, but the embodiment is not limited thereto. Here, the average diameter (D) means the average of diameters of the plurality of particles 130-1 to 130-4, and, for example, may be several tens of μm to several hundreds of μm.

When the separation distance d between the plurality of first oxidation layers 150 is 0 or less, the trapped charge of the first oxidation layer 150 increases, thereby being capable of lowering the current efficiency and C-V characteristics. Further, when the separation distance d is larger than several hundreds of μm, the density of the plurality of particles 130-1 to 130-4 decreases in a given area, thereby being capable of lowering the current efficiency characteristic. In this case, the current density can be smaller than 200 A/cm$^2$. Therefore, the separation distance d may be greater than 0 and less than several hundred of μm.

Figure 3:
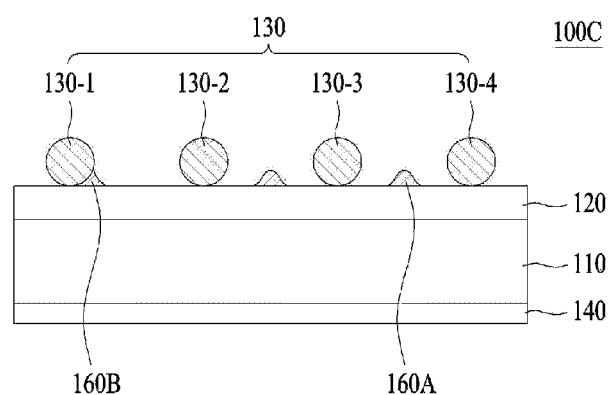
FIG. 3 shows a cross-sectional view of a semiconductor device according to still another embodiment.

FIG. 3 shows a cross-sectional view of a semiconductor device 100C according to still another embodiment.

Unlike the semiconductor device 100A shown in FIG. 1, the semiconductor device 100C shown in FIG. 3 may further second oxidation layers 160A and 160B. Except for this, the semiconductor device 100C shown in FIG. 3 is the same as the semiconductor device 100A shown in FIG. 1, and thus is designated by the same reference numerals and a repeated description thereof is omitted or the description of FIG. 1 is substituted for the description of FIG. 3.

The second oxidation layers 160A and 160B may be disposed between the plurality of particles 130-1 to 130-4 over the epitaxial layer 120. At this time, as shown in FIG. 3, the second-first oxidation layer 160A may be disposed to be apart from the plurality of particles 130 and the second-second oxidation layer 160B may be disposed in contact with the particle 130. That is, the second-second oxidation layer 160B has the same shape as the first oxidation layer 150.

In addition, the second oxidation layers 160A and 160B may be smaller in size than the particles 130-1 to 130-4.

Alternatively, the semiconductor device 100C may include only the second-first oxidation layer 160A disposed to be apart from the plurality of particles 130-1 to 130-4, or only the second-second oxidation layer 160B arranged in contact with the plurality of particles 130-1 to 130-4.

Figure 4:
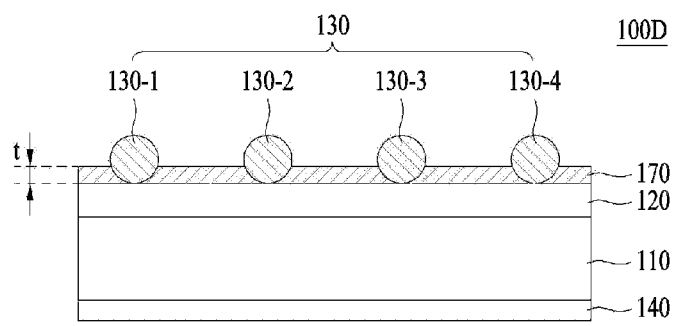
FIG. 4 shows a cross-sectional view of a semiconductor device according to still another embodiment.

FIG. 4 shows a cross-sectional view of a semiconductor device 100D according to still another embodiment.

Like the second oxidation layers 160A and 160B shown in FIG. 3, the second oxidation layer 170 shown in FIG. 4 is disposed between the plurality of particles 130-1 through 130-4 on the epitaxial layer 120. However, unlike the second oxidation layers 160A and 160B shown in FIG. 3, the second oxidation layer 170 shown in FIG. 4 may have a plate-like cross-sectional shape. Except for this, the semiconductor device 100D shown in FIG. 4 is the same as the semiconductor device 100A shown in FIG. 1 and thus is designated by the same reference numerals and a repeated description thereof is omitted.

In addition, the thickness t of the second oxidation layer 170 may be 2 nm and may be a natural oxide film.

Figure 5:
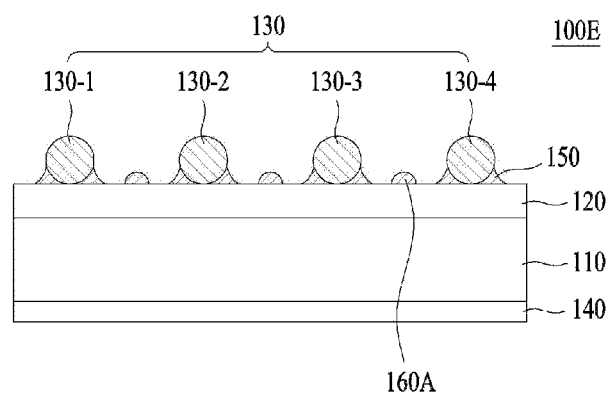
FIG. 5 shows a cross-sectional view of a semiconductor device according to still another embodiment.

FIG. 5 shows a cross-sectional view of a semiconductor device 100E according to still another embodiment.

Unlike the semiconductor device 100B shown in FIG. 2 including only the first oxidation layer 150, the semiconductor device 100E shown in FIG. 5 may include a second-first oxidation layer 160A as well as a first oxidation layer 150.

That is, like the first oxidation layer 150 shown in FIG. 2, the first oxidation layer 150 shown in FIG. 5 may be disposed between the plurality of particles 130-1 to 130-4 and the epitaxial layer 120. In addition, like the second-first oxidation layer 160A shown in FIG. 3, the second oxidation layer 160A may be disposed over the epitaxial layer 120 between the first oxidation layers 150. At this time, instead of the second oxidation layer 160A, the second-second oxidation layer 160B, as shown in FIG. 3, which is in electrical contact with the particles 130-1, may be disposed on the epitaxial layer 120 together with the first oxidation layer 150.

As shown in FIG. 5, the first and second oxidation layers 150 and 160A may be disposed to be apart from each other. Alternatively, unlike that shown in FIG. 5, the first and second oxidation layers 150 and 160A may be integrally formed.

Also, the width of the aforementioned first or second oxidation layer 150, 160A, or 160B may be nanometer (nm) in size.

When implemented as shown in FIG. 4 among the semiconductor devices 100A to 100E shown in FIGS. 1 to 5, the semiconductor device may have excellent breakdown voltage characteristics. When implemented as shown in FIG. 2, the semiconductor device may have excellent current efficiency.

Figure 6A:
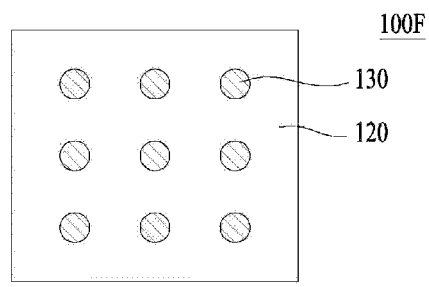
FIGS. 6a to 6c show plan views of a variety of semiconductor devices according to the embodiment.
Figure 6B:
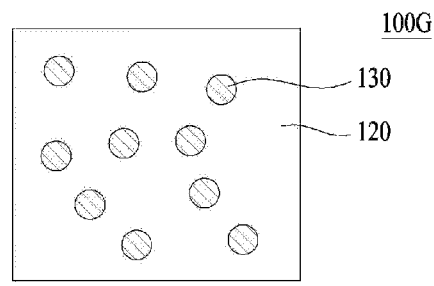
Figure 6C:
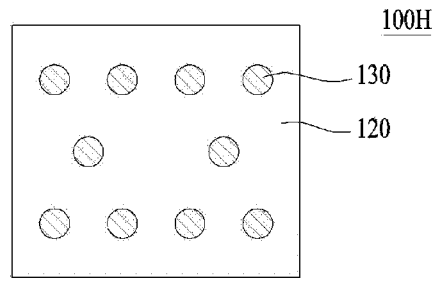

FIGS. 6a to 6c show plan views of a variety of semiconductor devices 100F, 100G, and 100H according to the embodiment.

Each of the semiconductor devices 100F, 100G, and 100H shown in FIGS. 6a to 6c may have the cross-sectional shapes similar to that of the semiconductor devices 100A, 100B, 100C, 100D, and 100E shown in FIGS. 1 to 5.

First, as shown in FIG. 6a, in the semiconductor device 100F, the plurality of particles 130 may have a planar shape arranged in a matrix form. Alternatively, as shown in FIG. 6b, in the semiconductor device 100G, the plurality of the particles 130 may have a planar shape arranged in random form. Alternatively, as shown in FIG. 6c, in the semiconductor device 100H, the plurality of the particles 130 may have a planar shape arranged in a honeycomb form. Besides, although not shown, the plurality of particles 130 may have various planar shapes. That is, according to still another embodiment, the semiconductor device may include the plurality of particles 130 having planar shapes mixed with the planar shapes shown in FIGS. 6a to 6c.

In addition, when the interval between the plurality of particles 130 is small, that is, when the density of a plurality of particles is high, the on-resistance $r_{ON}$ can be reduced and the threshold voltage Vth can be lowered.

Figure 7A:
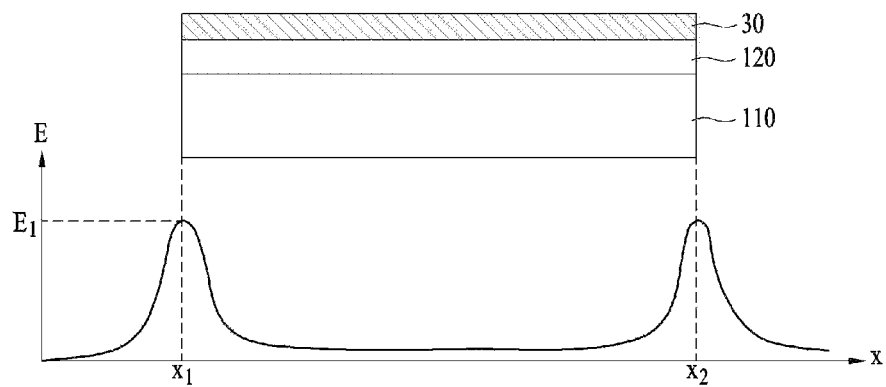
FIG. 7a shows a cross-sectional view and a graph relating to an electric field of a semiconductor device according to a comparative example.
Figure 7B:
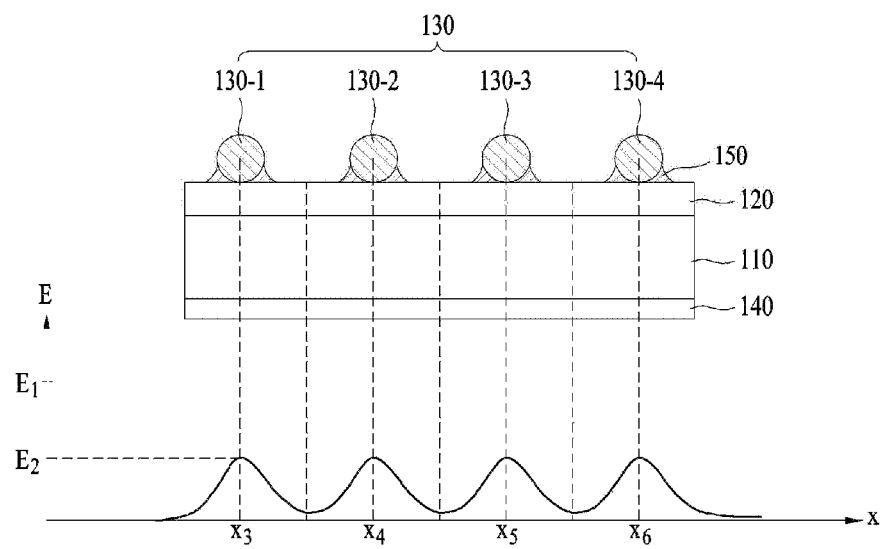
FIG. 7b shows a cross-sectional view and a graph relating to an electric field of the semiconductor device shown in FIG. 2.

FIG. 7a shows a cross-sectional view and a graph relating to an electric field (E: Electric field) of a semiconductor device according to a comparative example, and FIG. 7b shows a cross-sectional view and a graph relating to an electric field of the semiconductor device 100B shown in FIG. 2. In the electric field graphs shown in FIGS. 7A and 7B, the abscissa axis represents the distance (x) and the ordinate axis represents the electric field (E).

The semiconductor device according to the comparative example shown in FIG. 7a may be composed of the substrate 110, the epitaxial layer 120, and the plate-shaped electrode 30. When the electrode 30 has this shape, the electric field is concentrated at the edge (x=x1, x=x2) of the interface of the electrode 30. Therefore, it can be seen that the first electric field (E=E1) at each edge (x=x1, x=x2) is very high. As a result, when the breakdown occurs, the semiconductor device shown in FIG. 7a may be in an inoperative state.

On the other hand, in the semiconductor device 100B according to the embodiment shown in FIG. 7b, since the cluster electrode 130 is made up of a plurality of particles 130-1 to 130-4, it can be seen that the second electric field E2 at each of positions (x3, x4, x5, x6) of the particles 130-1 to 130-4 may be much lower than the first electric field E1, as compared with the comparative example shown in FIG. 7a. That is, since the electric field is dispersed in each of the plurality of particles 130-1 to 130-4, the second electric field E2 can be much lower than the first electric field E1. Thus, in the case of the semiconductor device according to the embodiment, since the phenomenon of concentration of the electric field is prevented, the semiconductor device 100B can have improved withstand voltage characteristics.

Hitherto, the breakdown voltage characteristics of the semiconductor device 100B shown in FIG. 2 are only discussed. However, also in the case of the semiconductor devices 100A and 100C to 100E shown in FIGS. 1 and 3 to 5, since the electrode 130 is in the form of the plurality of particles 130-1 to 130-4 as in the case of the semiconductor device 100B shown in FIG. 2, the breakdown voltage characteristic can be improved and excellent withstand voltage characteristics can be obtained.

Hereinafter, a method of manufacturing the semiconductor device 100B shown in FIG. 2 will be described with reference to the attached FIGS. 8a to 8d. Although the manufacturing methods of the semiconductor devices 100A, 100C, 100D, and 100E shown in FIGS. 1 and 3 to 5 are omitted, the semiconductor devices 100A, 100C, 100D, and 100E may be manufactured at the level of those skilled in the art by applying FIGS. 8a to 8d.

FIGS. 8a to 8d show process cross-sectional views illustrating a method of manufacturing the semiconductor device 100B shown in FIG. 2.

Figure 8A:
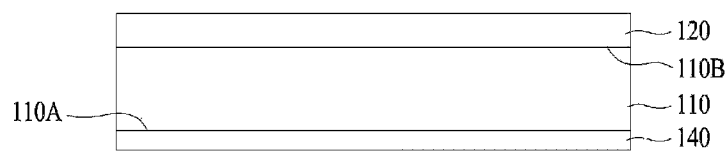
FIGS. 8a to 8d show process cross-sectional views illustrating a method of manufacturing the semiconductor device shown in FIG. 2.

First, referring to FIG. 8A, the lower electrode 140 and the epitaxial layer 120 are formed at a back surface 110A and a front surface 110B of a substrate 110, respectively. Here, the lower electrode 140 may be formed of a metal material, for example, a refractory metal or a mixture of such refractory metals. Alternatively, the lower electrode 140 may be formed of at least one of platinum (Pt), germanium (Ge), copper (Cu), chromium (Cr), nickel (Ni), gold (Au), titanium (Ti), aluminum (Al), tantalum (Ta), tantalum nitride (TaN), titanium nitride (TiN), palladium (Pd), tungsten (W), or tungsten silicide ($WSi_2$).

Each of the substrate 110 and the epitaxial layer 120 may be formed of at least one of a group IV semiconductor, a group III-V compound semiconductor, or a group II-VI compound semiconductor.

Figure 8B:
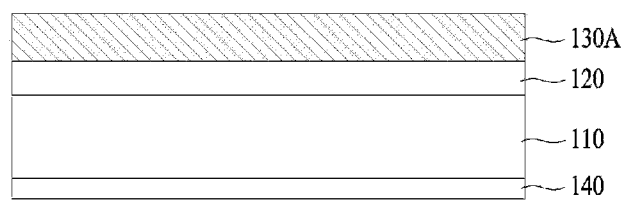

Next, referring to FIG. 8b, a metal thin film layer 130A is formed on the epitaxial layer 120. The metal thin film layer 130A may be formed of at least one of silver (Ag), aluminum (Al), gold (Au), chrome (Cr), copper (Cu), nickel (Ni), titanium (Ti), or tungsten (W).

Figure 8C:
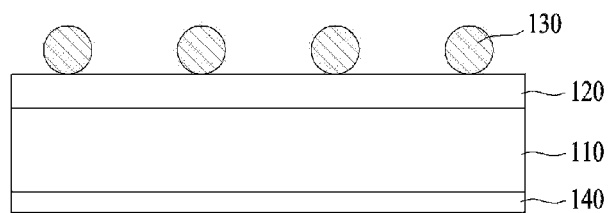

Next, referring to FIG. 8c, the metal thin film layer 130A is heat-treated to form a cluster electrode 130 composed of a plurality of particles 130. For example, the metal thin film layer 130A may be subjected to Rapid Thermal Processing (RTP), Rapid Thermal Annealing (RTA), or a furnace thermal processing or the like in a temperature range of 100° C. to 1500° C., thereby forming the plurality of particles 130 from the metal thin film layer 130A.

Figure 8D:
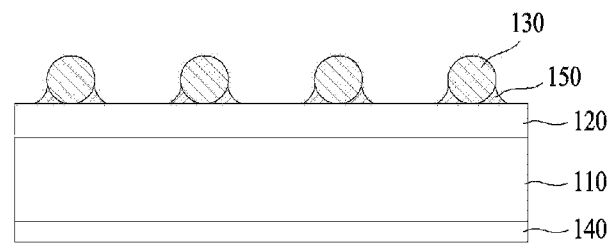

Next, referring to FIG. 8d, the resultant shown in FIG. 8c is oxidized to form the first oxidation layer 150. For example, when the resultant shown in FIG. 8c is oxidized within a temperature range of 500° C. to 1400° C. using a thermal wet oxidation furnace, the first oxidation layer 150 may be formed in a wedge shape between the plurality of particles 130 and the epitaxial layer 120.

When the electrode 30 is formed as in the comparative example shown in FIG. 7a, a masking process and an etching process are required for forming the electrode 30. But, when the electrode 130 is formed as shown in FIG. 7b or FIG. 8c, the masking and etching processes are unnecessary. Thus, it is possible to reduce the process cost and shorten the process time.

Meanwhile, the semiconductor devices 100A to 100E according to the above-described embodiments can be applied to various fields. For example, the semiconductor devices 100A to 100E may be applied to a light emitting diode, or may be applied to the power devices such as a Schottky barrier diode, a metal semiconductor field effect transistor, and a high electron mobility transistor (HEMT).

According to one application, the semiconductor devices 100A to 100D shown in FIGS. 1 to 5 may be vertical type Schottky diodes. In this case, the lower electrode 140 may correspond to the anode of the Schottky diode, and the cluster electrode 130 may correspond to the cathode of the Schottky diode. Alternatively, conversely, the lower electrode 140 and the cluster electrode 130 may correspond to the cathode and the anode of the Schottky diode, respectively.

According to another application, the semiconductor devices 100A to 100E shown in FIGS. 1 to 5 may be applied to light emitting diodes. This will be described with reference to the attached FIG. 9 as follows.

Figure 9:
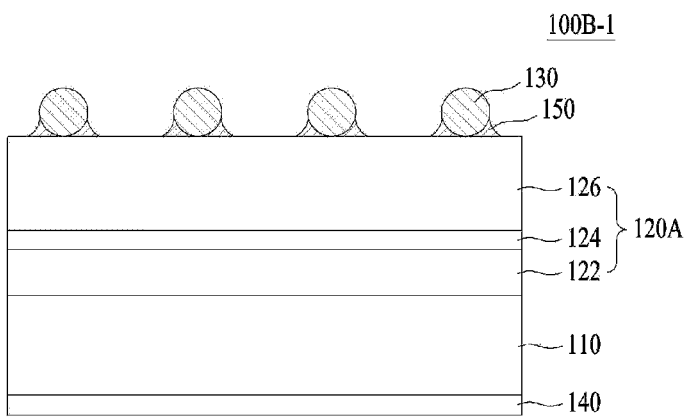
FIG. 9 shows a cross-sectional view of one application of the semiconductor device shown in FIG. 2.

FIG. 9 shows a cross-sectional view of one application 100B-1 of the semiconductor device 100B shown in FIG. 2.

The substrate 110, the epitaxial layer 120A, the plurality of particles 130, the lower electrode 140, and the first oxidation layer 150 of the semiconductor device 100B-1 shown in FIG. 9 correspond to the substrate 110, the epitaxial layer 120, the plurality of particles 130, the lower electrode 140, and the first oxidation layer 150 shown in FIG. 2, respectively.

In particular, the epitaxial layer 120A may include a light emitting structure. The light emitting structure includes a first conductive semiconductor layer 122, an active layer 124, and a second conductive semiconductor layer 126 disposed on the substrate 110.

The first conductive semiconductor layer 122 may be disposed between the substrate 110 and the active layer 124 and may be implemented in compound semiconductor. The first conductive semiconductor layer 122 may be implemented in group III-V or II-VI compound semiconductors. For example, the first conductive semiconductor layer 122 may comprise a semiconductor material having a composition of $In_xAl_yGa_{1-x-y}N$ (0≤x≤1, 0≤y≤1, 0≤x+y≤1). The first conductive semiconductor layer 122 may be doped with a first conductive dopant. When the first conductive semiconductor layer 122 is an p-type semiconductor layer, the first conductive dopant may include, for example, Mg, Zn, Ca, Sr, Ba, etc. as a p-type dopant.

The active layer 124 may be disposed between the first conductive semiconductor layer 122 and the second conductive semiconductor layer 126 and is a layer in which holes (or electrons) injected through the first conductive semiconductor layer 122 and electrons (or holes) injected through the second conductive semiconductor layer 126 meet each other to emit light having energy determined by an inherent energy band of a constituent material of the active layer 124.

The active layer 124 may be formed into at least one structure of a single-well structure, a multi-well structure, a single-quantum well structure, a multi-quantum well MQW structure, a quantum wire structure, or a quantum dot structure.

In the active layer 124, a well layer and a barrier layer may be formed in a pair structure of any one or more of InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer (not illustrated) may be formed above and/or under the active layer 124. The conductive clad layer may be formed of semiconductors having higher band gap energy than the band gap energy of the barrier layer of the active layer 124. For example, the conductive clad layer may include GaN, AlGaN, InAlGaN, or a super lattice structure, etc. In addition, the conductive clad layer may be doped with an n-type or p-type dopant.

The second conductive semiconductor layer 126 may be disposed over the active layer 124 and may be formed of group III-V or II-VI compound semiconductors doped with a second conductive dopant. When the second conductive semiconductor layer 126 is an n-type semiconductor layer, the second conductive dopant may include Si, Ge, Sn, Se, Te as an n-type dopant, without being limited thereto.

For example, the second conductive semiconductor layer 126 may include a semiconductor material having a composition of $Al_xIn_yGa_{(1-x-y)}N$ ($0 \le x \le 1$, $0 \le y \le 1$, $0 \le x+y \le 1$). The second conductive semiconductor layer 126 may include any one or more materials selected from among GaN, InN, AlN, InGaN, AlGaN, InAlGaN, AlInN, AlGaAs, InGaAs, AlInGaAs, GaP, AlGaP, InGaP, AlInGaP, and InP.

At this time, the lower electrode 140 serves to supply holes (or electrons), which are the first conductivity type carriers, to the first conductive semiconductor layer 122, and the cluster electrode 130 serves to supply electrons (or holes), which are the second conductivity type carriers, to the second conductive semiconductor layer 126. The lower electrode 140 may be formed of a metal having excellent electrical conductivity and of a metal having a high thermal conductivity since heat generated during operation of the semiconductor device 100B-1 must be sufficiently dissipated.

For example, the lower electrode 140 may be made of a material selected from the group consisting of molybdenum (Mo), silicon (Si), tungsten (W), copper (Cu), and aluminum (Al), or alloy thereof or may selectively include Gold (Au), copper alloy (Cu Alloy), nickel (Ni), copper-tungsten (Cu—W), a carrier wafer (e.g., GaN, Si, Ge, GaAs, ZnO, SiGe, SiC, SiGe, $Ga_2O_3$, etc.), etc.

The semiconductor device 100B-1 shown in FIG. 9 has a vertically-bonded structure, but the embodiment is not limited thereto. That is, the semiconductor devices 100A to 100E shown in FIGS. 1 to 5 may be applied to a light emitting device (not shown) having a horizontal bonding type or a flip chip bonding type structure.

According to still another application, the semiconductor devices 100A to 100E shown in FIGS. 1 to 5 may be applied to power devices. This will be described with reference to FIG. 10 attached hereto as follows.

Figure 10:
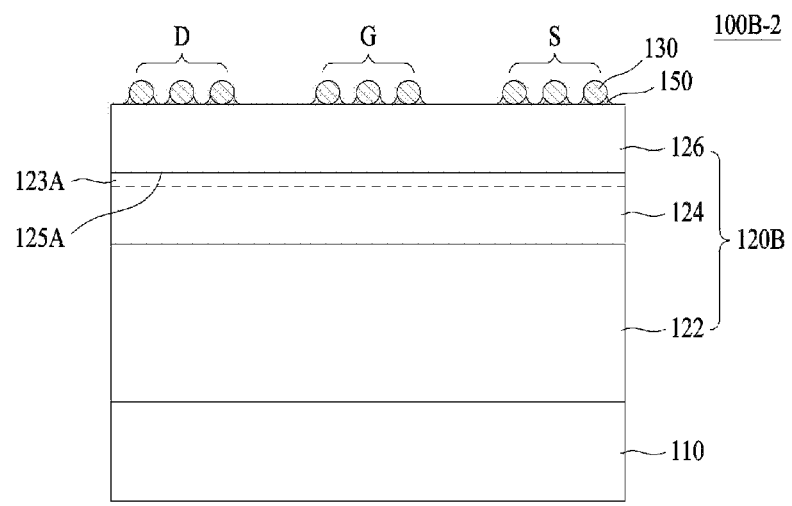
FIG. 10 shows a cross-sectional view of another application of the semiconductor device shown in FIG. 2.

FIG. 10 shows a cross-sectional view of another application 100B-2 of the semiconductor device 100B shown in FIG. 2.

The substrate 110, the epitaxial layer 120B, the plurality of the particles 130, and the first oxidation layer 150 of the semiconductor device 100B-2 shown in FIG. 10 correspond to the substrate 110, the epitaxial layer 120, the plurality of particles 130, and the first oxidation layer 150 shown in FIG. 2, respectively. Unlike the semiconductor device 100B shown in FIG. 2, the semiconductor device 100B-2 shown in FIG. 10 does not include the lower electrode 140. Except for this, the semiconductor device 100B-2 shown in FIG. 10 and the semiconductor device 100B shown in FIG. 2 have the same components.

In particular, the epitaxial layer 120B may include an intermediate layer 122, a channel layer 124, and an electron supply layer 126.

The intermediate layer 122 may be disposed on the substrate 110 and may impart compressive stress to the epitaxial layer 120B. When the compressive stress applied to the epitaxial layer 120B through the intermediate layer 122 increases, the epitaxial layer 120B having a relatively large thickness may be formed. That is, since the semiconductor device 100B-2 shown in FIG. 10 is a power semiconductor device, in case that the thickness of the intermediate layer 122 increases, the characteristics of the device may be improved for example, the breakdown voltage (BV) of the power device increases.

According to the embodiment, the intermediate layer 122 may be a super lattice (SL) layer. Here, the super lattice layer may be a layer in which the wave function overlaps with other super lattice layer adjacent thereto and the interval from the adjacent super lattice layer is 3 nm to 4 nm, but, the embodiment is not limited thereto.

In some cases, the intermediate layer 122 may be omitted.

The channel layer 124 may be disposed over the intermediate layer 122, and between the intermediate layer 122 and the electron supply layer 126. The channel layer 124 may be implemented as an undoped layer to enhance the mobility of electrons and may include at least one GaN layer.

The electron supply layer 126 is disposed over the channel layer 124, helps to form the channel 123A, and serves to warp band gap energy. As a layer having a band width larger than that of the channel 123A, the electron supply layer 126 may have a uniform polarization density throughout the layer. The electron supply layer 126 has a smaller lattice integer than the channel layer 124. Therefore, the electron supply layer 126 and the channel layer 124 may form a heterojunction interface 125A. In this way, when the electron supply layer 126 and the channel layer 124, the lattice integers of the electron supply layer 126 and the channel layer 124 being different from each other, form the heterojunction interface 125A, the spontaneous polarization and piezoelectric polarization are brought about due to the lattice integer difference so that two-dimensional electron gas (2-DEG: 2-Dimensional Electron Gas), which is a channel in the channel layer 124 side at the heterogeneous junctions 125A may be generated. That is, when the gate bias is applied to the gate electrode G, the channel 123A is formed on the channel layer 124 side at the heterojunction interface 125A. As such, since the electron supply layer 126 plays the role of a barrier to the electron, the 2-DEG layer 123A may be formed in the channel layer 124 at the heterojunction interface 125A.

The electron supply layer 126 may be implemented in group III-V or II-VI compound semiconductors. For example, The electron supply layer 126 may include a semiconductor material having a composition of $Al_aIn_bGa_{(1-a-b)}N$ ($0 \leq a \leq 1$, $0 \leq b \leq 1$, $0 \leq a+b \leq 1$). The electron supply layer 126 may include a nitride semiconductor layer such as GaN, InN, AlN, InGaN, AlGaN, InAlGaN and AlInN, or at least one of AlGaAs, InGaAs, AlInGaAs, GaP, AlGaP, InGaP, AlInGaP, or InP. For example, the electron supply layer 126 may comprise AlGaN or $Al_xInGaN$. Further, the electron supply layer 126 may be an undoped layer in order to improve the mobility of electrons.

A gate electrode G, a source contact S, and a drain contact D may be disposed on the electron supply layer 126. Each of the gate electrode G, the source contact S, and the drain contact D may be a cluster electrode 130 having a plurality of particles as shown. The source contact S is disposed on the electron supply layer 126 to be apart from one side of gate electrode G. The drain contact D is disposed on the electron supply layer 126 to be apart from the other side of the gate electrode G.

Each of the plurality of particles in each of the source contact S and the drain contacts D may be formed of a metal. In addition, each of the source contact S and the drain contact D may include the same material as the material of the gate electrode G. Further, each of the source contact S and the drain contact D may be formed of a reflective electrode material having an ohmic characteristic.

The embodiment is not limited by the shape and structure of the gate electrode G, the source contact S, and the drain contact D illustrated as an example in FIG. 10. That is, according to another embodiment, a gate insulating layer (not shown) may be further disposed between the gate electrode G and the electron supply layer 126.

Hereinafter, a light emitting device package 200 including the semiconductor device 100B-1 shown in FIG. 9 will be described with reference to FIG. 11 as follows.

Figure 11:
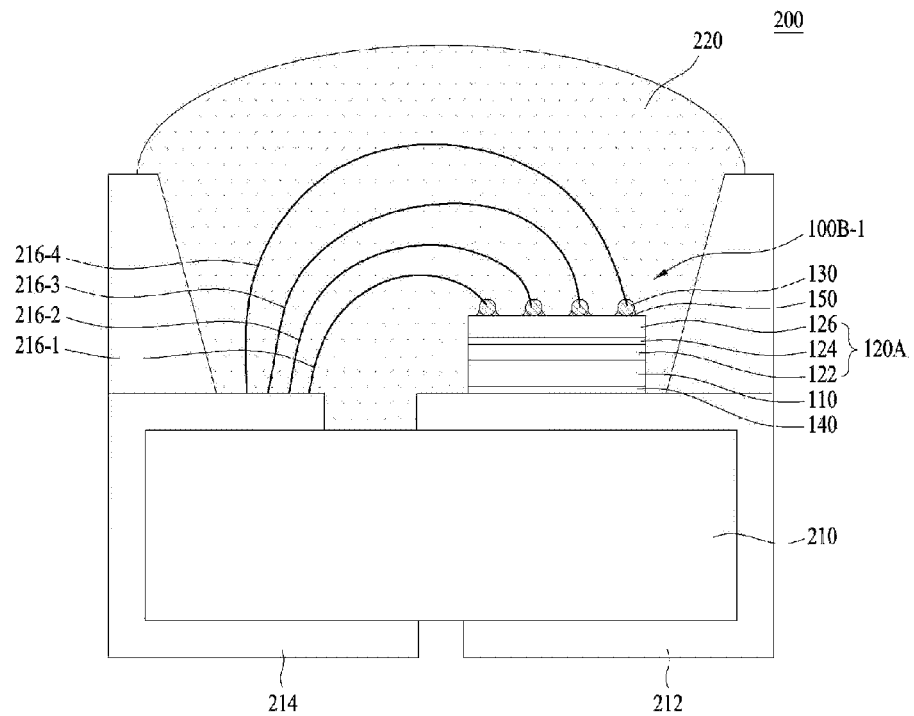
FIG. 11 shows a cross-sectional view of a light emitting device package according to the embodiment.

FIG. 11 shows a cross-sectional view of a light emitting device package 200 according to the embodiment.

The light emitting device package 200 shown in FIG. 11 may include the semiconductor device 100B-1, a body 210, first and second lead frames 212 and 214, a molding member 220, and wires 216-1, 216-2, 216-3, and 216-4. The semiconductor device 100B may correspond to the semiconductor device 100B-1 shown in FIG. 9.

The first and second lead frames 212 and 214 are electrically separated from each other. The molding member 220 may be filled in the cavity formed by the body 210 to surround and protect the semiconductor device 100B-1. Further, the molding member 220 may include a phosphor to convert the wavelength of the light emitted from the semiconductor device 100B-1.

The lower electrode 140 of the semiconductor device 100B-1 may correspond to the anode of the light emitting device and may be electrically connected to the first lead frame 212 directly. At this time, the plurality of particles 130-1, 130-2, 130-3, and 130-4 forming the cluster electrode 130 in the semiconductor device 100B-1 may correspond to the cathode of the light emitting device. Alternatively, the lower electrode 140 may correspond to the cathode of the light emitting device, and the cluster electrode 130 may correspond to the anode of the light emitting device.

At this time, the plurality of particles 130-1, 130-2, 130-3, and 130-4 of the cluster electrode 130 are electrically connected to the plurality of wires 216-1, 216-2, 216-3, and 216-4, respectively, and may be connected to the second lead frame 214 through the wires 216-1, 216-2, 216-3, and 216-4.

Alternatively, unlike FIG. 11, the lower electrode 140 is electrically in direct contact with the second lead frame 214 instead of the first lead frame 212, and the plurality of particles 130-1 to 130-4 may be electrically connected to the first lead frame 212 instead of the second lead frame 214 through each of the wires 216-1 to 216-4, respectively.

Referring to FIG. 11, it can be known that the wires 216-1, 216-2, 216-3, and 216-4 are connected to each of the particles 130-1, 130-2, 130-3, and 130-4 shown in FIGS. 1 to 5, respectively.

Although the present invention has been described with reference to exemplary embodiments thereof, the present invention is not limited to the these embodiments and it should be understood that numerous other modifications and applications which are not aforementioned can be devised by those skilled in the art that will fall within the spirit and scope of the principles of this disclosure. For example, each component that is specifically shown in the embodiments can be modified and implemented. And, it should be understood that differences related to such variations and applications are included in the scope of the present invention set out in the appended claims.

MODE FOR INVENTION

Embodiments for implementation of this disclosure have sufficiently described in the above "Best Mode".

INDUSTRIAL APPLICABILITY

The semiconductor device according to the embodiment may be used as the power semiconductor device such as Schottky barrier diode, metal semiconductor field effect transistor, or High Electron Mobility Transistor HEMT.

The invention claimed is:

1. A semiconductor device, comprising:
a substrate;
an epitaxial layer on the substrate;
a cluster electrode including a plurality of particles disposed on the epitaxial layer, the particles being disposed to be apart from each other, and contacting the epitaxial layer;
first oxidation layers disposed between the plurality of particles and the epitaxial layer, and contacting at least one of the particles or the epitaxial layer; and
a second oxidation layer disposed between the particles and on the epitaxial layer, the second oxidation layer being disposed to be apart from the plurality of particles and contacting the epitaxial layer.

2. The semiconductor device according to claim 1, wherein each of the plurality of particles has a spherical shape.

3. The semiconductor device according to claim 1, wherein the first oxidation layers are disposed in a wedge shape between the plurality of particles and the epitaxial layer.

4. The semiconductor device according to claim 1, wherein a separation distance between respective layers of the first oxidation layers is the same as an average diameter of the plurality of particles.

5. The semiconductor device according to claim 1, wherein a separation distance between respective layers of the first oxidation layers is greater than zero and smaller than several hundred micrometers.

6. The semiconductor device according to claim 1, wherein the first and second oxidation layers are disposed to be apart from each other.

7. The semiconductor device according to claim 1, further comprising a lower electrode disposed on a bottom surface of the substrate.

8. The semiconductor device according to claim 1, wherein the plurality of the particles is disposed at equal intervals from each other.

9. The semiconductor device according to claim 1, wherein the plurality of the particles is disposed at different intervals from each other.

10. The semiconductor device according to claim 1, wherein each of the particles includes at least one of Ag, Al, Au, Cr, Cu, Ni, Ti, or W.

11. The semiconductor device according to claim 1, wherein at least one of the epitaxial layer or the substrate includes at least one of group IV semiconductor, group III-V compound semiconductor, or group II-VI compound semiconductor.

12. The semiconductor device according to claim 1, wherein a volume of each of the plurality of particles is several $\mu m^3$ to several hundred $\mu m^3$.

13. The semiconductor device according to claim 1, wherein the first oxidation layers are smaller in size than each of the particles.

14. The semiconductor device according to claim 1, wherein the second oxidation layer is smaller in size than each of the particles.

* * * * *